United States Patent
Sato et al.

(10) Patent No.: US 7,492,033 B2
(45) Date of Patent: Feb. 17, 2009

(54) SEMICONDUCTOR MEMORY DEVICE (75) Inventors: Homare Sato, Tokyo (JP); Kiyoshi Nakai, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/602,947

(22) Filed: Nov. 22, 2006

(65) Prior Publication Data
US 2007/0120128 A1 May 31, 2007

(30) Foreign Application Priority Data
Nov. 25, 2005 (JP) .............................. 2005-339735

(51) Int. Cl.
*G11C 11/00* (2006.01)
(52) U.S. Cl. ........................ 257/536; 257/401; 365/148; 365/100
(58) Field of Classification Search ................. 257/401, 257/536, 537, 379, E27.009, E27.016; 365/100, 365/148
See application file for complete search history.

(56) References Cited

U.S. PATENT DOCUMENTS 4,821,084 A * 4/1989 Kinugasa et al. ............ 257/288
4,860,070 A * 8/1989 Arimoto et al. ............. 257/301
6,847,113 B2 1/2005 Nakanishi et al.
6,862,214 B2 3/2005 Lee et al.
2006/0034112 A1 * 2/2006 Oh et al. ..................... 365/148

FOREIGN PATENT DOCUMENTS

CN     1484254     3/2004
JP     2005-71500  3/2005

OTHER PUBLICATIONS

Chinese Office Action, with English Translation, issued in Chinese Patent Application No. CN 200610163036.7 dated on Aug. 29, 2008.

* cited by examiner

*Primary Examiner*—Zandra Smith
*Assistant Examiner*—Paul E Patton
(74) *Attorney, Agent, or Firm*—McDermott Will & Emery LLP (57) ABSTRACT

A semiconductor memory device includes a plurality of active regions, and a gate electrode in a fish bone shape arranged on each active region. In each active region, a plurality of source regions and a plurality of drain regions are arranged in a matrix manner. The source regions are commonly connected to a source line, and the drain regions are each connected to a lower electrode of a different memory element. According to the present invention, it is possible to assign three cell transistors connected in parallel to one memory element, so that an effective gate width is further increased.

17 Claims, 9 Drawing Sheets

SEMICONDUCTOR MEMORY DEVICE

TECHNICAL FIELD

The present invention relates to a semiconductor memory device. More specifically, the present invention relates to a semiconductor memory device that holds information depending on the presence or absence of a current that flows through a cell transistor, the magnitude of a current that flows through the cell transistor, or the like.

BACKGROUND OF THE INVENTION

Personal computers and servers and the like use a hierarchy of memory devices. There is lower-tier memory, which is inexpensive and provides high storage capacity, while memory higher up the hierarchy provides high-speed operation. The bottom tier generally consists of magnetic storage such as hard disks and magnetic tape. In addition to being non-volatile, magnetic storage is an inexpensive way of storing much larger quantities of information than solid-state devices such as semiconductor memory. However, semiconductor memory is much faster and can access stored data randomly, in contrast to the sequential access operation of magnetic storage devices. For these reasons, magnetic storage is generally used to store programs and archival information and the like, and, when required, this information is transferred to main system memory devices higher up in the hierarchy.

Main memory generally uses dynamic random access memory (DRAM) devices, which operate at much higher speeds than magnetic storage and, on a per-bit basis, are cheaper than faster semiconductor memory devices such as static random access memory (SRAM) devices.

Occupying the very top tier of the memory hierarchy is the internal cache memory of the system microprocessor unit (MPU). The internal cache is extremely high-speed memory connected to the MPU core via internal bus lines. The cache memory has a very small capacity. In some cases, secondary and even tertiary cache memory devices are used between the internal cache and main memory.

DRAM is used for main memory because it offers a good balance between speed and bit cost. Moreover, there are now some semiconductor memory devices that have a large capacity. In recent years, memory chips have been developed with capacities that exceed one gigabits. DRAM is volatile memory that loses stored data if its power supply is turned off. That makes DRAM unsuitable for the storage of programs and archival information. Also, even when the power supply is turned on, the device has to periodically perform refresh operations in order to retain stored data, so there are limits as to how much device electrical power consumption can be reduced, while yet a further problem is the complexity of the controls run under the controller.

Semiconductor flash memory is high capacity and non-volatile, but requires high current for writing and erasing data operations, and these operation times are long. These drawbacks make flash memory an unsuitable candidate for replacing DRAM in main memory applications. There are other non-volatile memory devices, such as magnetoresistive random access memory (MRAM) and ferroelectric random access memory (FRAM), but they cannot easily achieve the kind of storage capacities that are possible with DRAM.

Another type of semiconductor memory that is being looked to as a possible substitute for DRAM is phase change random access memory (PRAM), which uses phase change material to store data. In a PRAM device, the storage of data is based on the phase state of phase change material contained in the recording layer. Specifically, there is a big difference between the electrical resistivity of the material in the crystalline state and the electrical resistivity in the amorphous state, and that difference can be utilized to store data.

This phase change is effected by the phase change material being heated when a write current is applied. Data is read by applying a read current to the material and measuring the resistance. The read current is set at a level that is low enough not to cause a phase change. Thus, the phase does not change unless the material is heated to a high temperature, so data is retained even when the power supply is switched off.

In order to rewrite the data, it is necessary to pass a sufficient amount of current for causing a phase change. To change the phase from the crystalline phase to the amorphous phase, a particularly large amount of current is required as compared to changing the phase from the amorphous phase to the crystalline phase. Accordingly, if the cell transistor is miniaturized for enhancing a recording capacity, the current supply capability of the cell transistor decreases. As a result, a longer time is required to rewrite the data.

As a method for solving such a problem, Japanese Patent Application Laid Open No. 2005-71500 discloses a method in which two cell transistors connected in parallel are assigned to one non-volatile memory element. According to this method, an effective gate width is increased, thereby enhancing the current supply capability of the cell transistor.

However, when the cell transistor is further miniaturized, a sufficient amount of current cannot be secured in some cases even when the method described in Japanese Patent Application Laid Open No. 2005-71500 is employed. In order to achieve rewriting at a higher speed, the current supply capability of the cell transistor need to be further enhanced. Such challenge is particularly important for a so-called PRAM using the phase change material. At the same time, this challenge is equally important for other semiconductor memory devices that hold information depending on the presence or absence of a current that flows through a cell transistor, the magnitude of a current that flows through the cell transistor, or the like.

As another method for enhancing the current supply capability of the cell transistor, U.S. Pat. No. 6,862,214 discloses a method in which a transistor for short-circuiting adjacent memory cells is provided. When such a transistor is provided, however, the control becomes complicated since, for example, a bit line needs to be set to a temporary floating state.

SUMMARY OF THE INVENTION

The present invention has been achieved to solve the above problems. It is therefore an object of the present invention to provide a semiconductor memory device that holds information depending on the presence or absence of a current that flows through a cell transistor, the magnitude of a current that flows through the cell transistor, or the like, in which current supply capability of the cell transistor is enhanced.

A semiconductor memory device according to one aspect of the present invention comprises:

an active region having a plurality of source regions connected to a source line and a plurality of drain regions connected to a bit line;

a memory element connected between the drain region and the bit line; and a gate electrode formed on the active region, wherein the gate electrode includes a first portion formed on a boundary in a first direction between the source region and the drain region, and a second portion formed on a boundary in a second direction different from the first direction between the source region and the drain region, and the first portion and the second portion are short-circuited.

A semiconductor memory device according to another aspect of the present invention comprises:

a first drain region;

a first source region positioned in a first direction as viewed from the first drain region;

a second source region positioned in a second direction that intersects with the first direction as viewed from the first drain region;

a third source region positioned in a third direction that is opposite to the first direction as viewed from the first drain region;

a gate electrode arranged on a semiconductor substrate between the first drain region, and the first to the third source regions; and a memory element connected to the first drain region.

A semiconductor memory device according to still another aspect of the present invention comprises:

a plurality of source regions and a plurality of drain regions arranged in the a active region in a matrix manner;

a gate electrode for short-circuiting the source regions and the drain regions by application of a predetermined voltage, the gate electrode being formed on the active region;

a plurality of bit lines each arranged so as to correspond to the drain regions;

at least one source line provided in common to the source regions; and a plurality of memory elements each connected between the drain region and the bit line.

A semiconductor memory device according to still another aspect of the present invention comprises:

an active region that extends in a predetermined direction;

a plurality of source regions connected to a source line and a plurality of drain regions connected to a bit line, the source regions and the drain regions being arranged in the active region;

a memory element connected between the drain region and the bit line; and a gate electrode formed on the active region, wherein the gate electrode has a first portion that extends in the predetermined direction, and a plurality of second portions that intersect with the first portion and traverse on the active region.

A semiconductor memory device according to still another aspect of the present invention comprises:

a first active region;

a second active region adjacent to the first active region;

a plurality of source regions connected to a source line arranged in the first and the second active regions;

a plurality of drain regions connected to a bit line arranged in the first and the second active regions;

a memory element connected between the drain region and the bit line; and first and second gate electrodes each formed on the first and the second active regions, wherein the first and the second gate electrodes each has a first portion that extends in the first direction, and a plurality of second portions that intersect with the first portion and traverse on the active regions, and the second portion of the first gate electrode and the second portion of the second gate electrode are arranged to be deviated in the first direction.

According to the present invention, it is possible to assign at least three cell transistors connected in parallel to one memory element, thereby further increasing an effective gate width as compared to the conventional semiconductor memory device. The semiconductor memory device of the present invention does not require a complicated control unlike the conventional semiconductor memory device. Thus, the current supply capability of the cell transistor is further enhanced, so that when the present invention is applied to the PRAM, the writing speed can be increased as compared to the conventional case.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
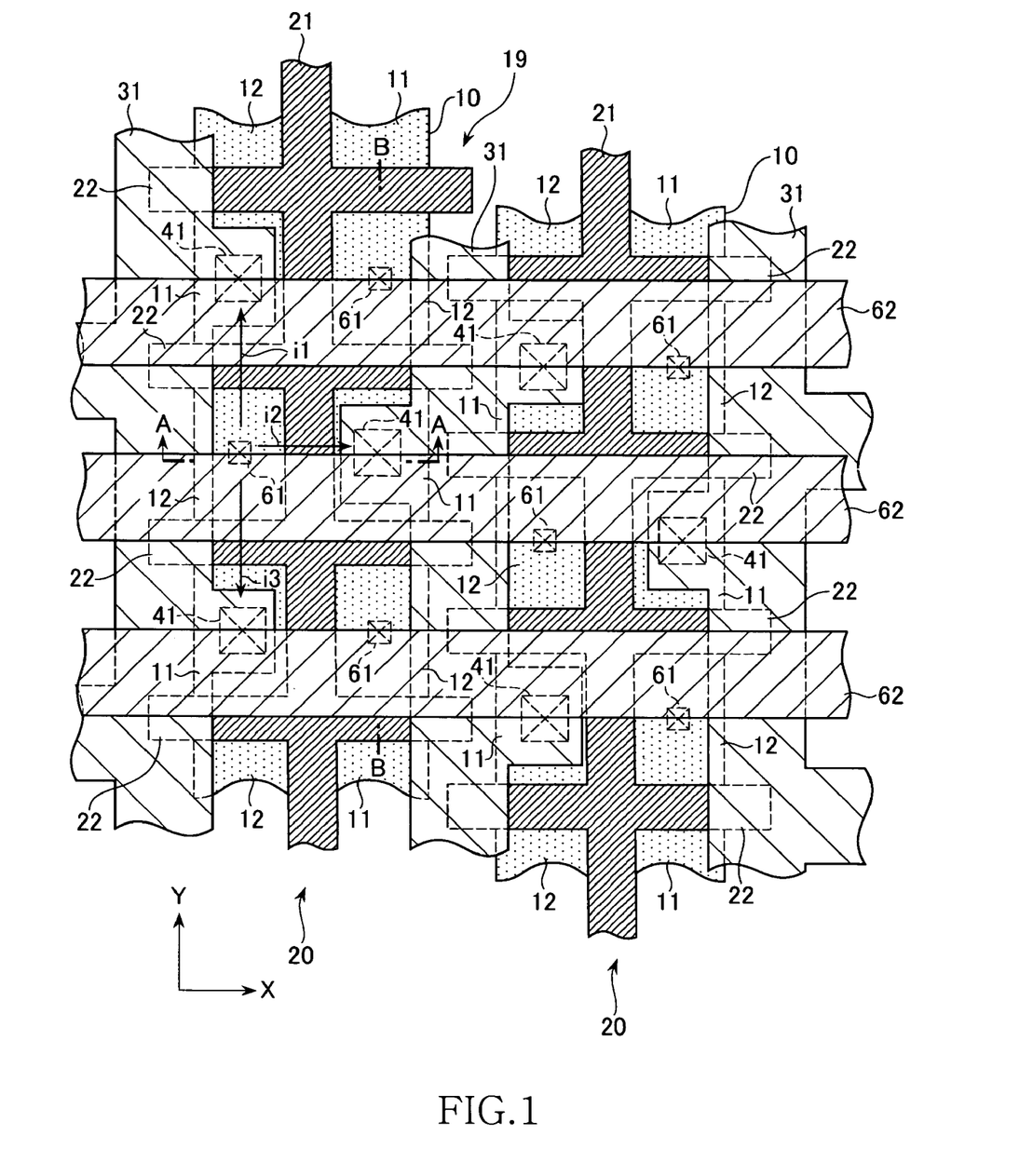
FIG. 1 is a schematic plan view of a structure of relevant parts of a semiconductor memory device according to a preferred embodiment of the present invention.
Figure 2:
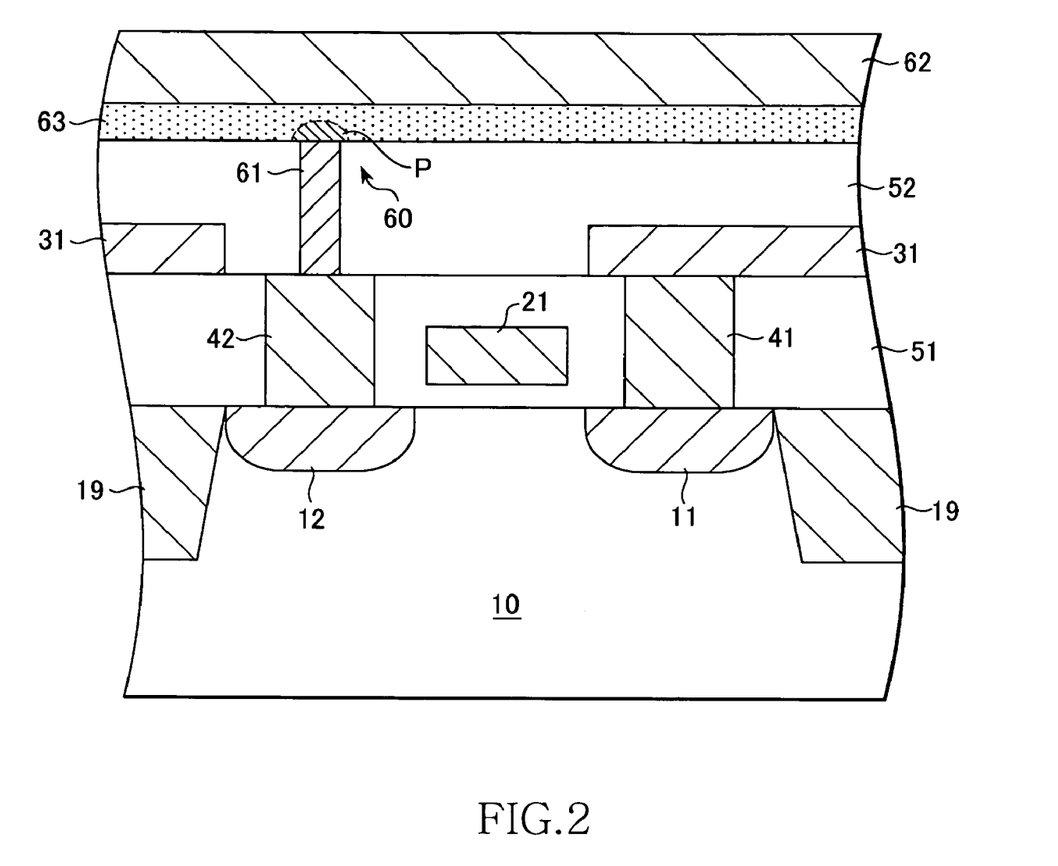
FIG. 2 is a schematic cross section taken along a line A-A shown in FIG. 1.
Figure 3:
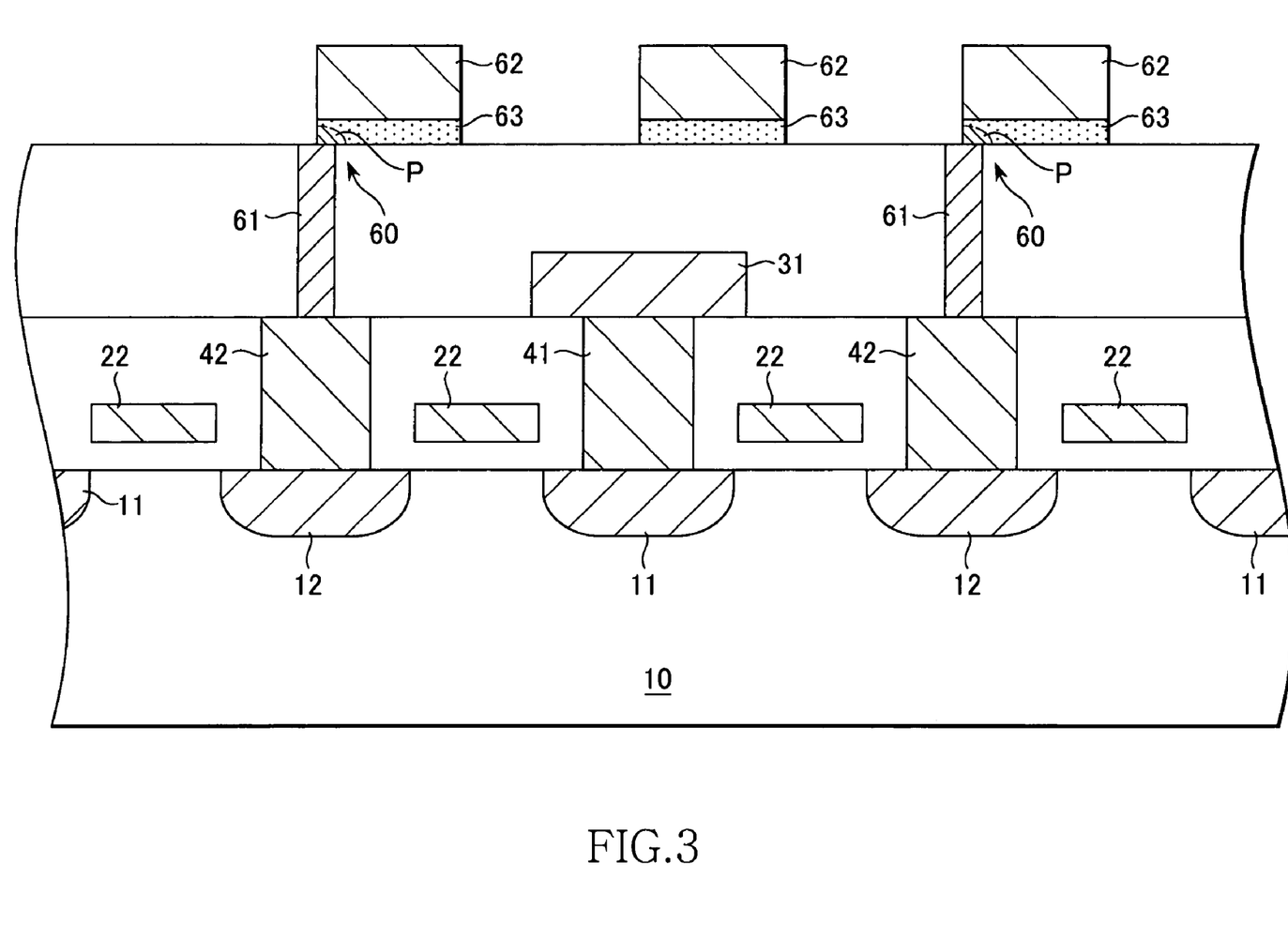
FIG. 3 is a schematic cross section taken along a line B-B shown in FIG. 1.

FIG. 1 is a schematic plan view of a structure of relevant parts of a semiconductor memory device according to a preferred embodiment of the present invention. FIG. 2 is a schematic cross section taken along a line A-A shown in FIG. 1. FIG. 3 is a schematic cross section taken along a line B-B shown in FIG. 1. The embodiment is a preferable one when the present invention is applied to a PRAM.

As shown in FIG. 1, the semiconductor memory device according to the embodiment includes a plurality of active regions 10, and a gate electrode 20 in a fish bone shape arranged on each active region 10.

The active regions 10 extend in a Y direction shown in FIG. 1. An element isolation region 19 is arranged between the active regions 10 adjacent in an X direction. Within the active regions 10, a plurality of source regions 11 and a plurality of drain regions 12 are arranged in a matrix manner. The source regions 11 are commonly connected to a source line 31 via a contact plug 41. On the other hand, the drain regions 12 are each connected to a different non-volatile memory element 60 via a contact plug 42, as shown in FIG. 2 and FIG. 3. The contact plugs 41 and 42 are arranged in an interlayer insulation film 51 that separates a semiconductor substrate and the source line 31.

In the present embodiment, there are two regions in total, one source region 11 on one side and one drain region 12 on the other side, adjacent in the X direction in the same active region 10. On the other hand, a large number of source regions 11 and drain regions 12 are alternately arranged in the Y direction. Therefore, this means that when a certain drain region 12 is considered, one source region 11 is always arranged adjacently in the X direction as viewed from this drain region 12. On the other hand, in the Y direction, both sides (the upper side and the lower side in FIG. 1) of the certain drain region 12 are each formed with the source region 11 adjacently. That is, the source regions 11 are arranged in three directions as viewed from each drain region 12.

The gate electrode 20 is arranged on the semiconductor substrate between the adjacent source regions 11 and the drain regions 12. More specifically, the gate electrode 20 has a first portion 21 that extends in the Y direction and second portions 22 that extend in the X direction. The first portion 21 and the second portions 22 intersect on the active region 10. The intersection is not steric but is on a same plane. Therefore, the first portion 21 and the second portions 22 short-circuit each other so as to form one gate electrode 20.

As shown in FIG. 1, there is one first portion 21 included in one gate electrode 20, and the first portion 21 extends in the Y direction along an approximate center of the corresponding active region 10. On the contrary, there are plural second portions 22 that extend in the X direction so as to traverse on the active region 10. The second portions 22 of the gate electrode 20 have a portion positioned on one side (right side in FIG. 1) as viewed from the first portion 21, and a portion positioned on the other side (left side in FIG. 1) as viewed from the first portion 21.

The first portion 21 of the gate electrode 20 is formed on a Y direction boundary line between the source region 11 and the drain region 12 adjacent in the X direction. On the other hand, the second portions 22 of the gate electrode 20 are formed on an X direction boundary line between the source regions 11 and the drain regions 12 adjacent in the Y direction. Therefore, when voltage that exceeds a threshold value is applied to a certain gate electrode 20, all source regions 11 and drain regions 12 included in the corresponding active region 10 become short-circuited.

The second portions 22 of the gate electrode 20 are arranged to be deviated by half a pitch in the Y direction relative to the second portions 22 of the gate electrode 20 corresponding to the adjacent active region 10. Needless to say, corresponding to this arrangement, the source regions 11 and the drain regions 12 are formed to be deviated by half a pitch in the Y direction between the adjacent active regions 10. This arrangement prevents interference of the second portions 22 of the adjacent gate electrodes 20. Thus the distance between the adjacent active regions 10 (width of the element isolation region 19 in the X direction) can be decreased, thereby enhancing the integration.

The configuration of the non-volatile memory element 60 will be described next.

As shown in FIG. 2 and FIG. 3, the non-volatile memory element 60 includes a lower electrode 61, an upper electrode 62, and a recording layer 63 arranged between the both electrodes.

The lower electrode 61 is used as a heater plug. That is, the lower electrode 61 serves as one portion of a heating element at the time of data writing. For this reason, examples of materials used for the lower electrode 61 preferably include a material having relatively high electric resistance such as metal silicide, metal nitride, and nitride composed of metal silicide. Examples are not restrictive, but preferably include high-melting metals such as W, TiN, TaN, WN, and TiAlN, nitride composed thereof, and nitride composed of high-melting metal silicide such as TiSiN and WSiN. Materials such as TiCN are further preferably used.

The lower electrode 61 is designed to have a diameter smaller than that of the contact plug 42 to reduce a contact area with the recording layer 63. This is because the smaller the contact area between the lower electrode 61, which is a heater, and the recording layer 63, the higher the heat radiation efficiency. As a result, rewriting at a higher speed becomes possible. In the embodiment, the lower electrode 61 is a plug arranged in the interlayer insulation film 52 that separates the source line 31 and the recording layer 63. The present invention, however, is not limited thereto. The plane shape can be a ring shape, for example.

The upper electrode 62 also serves as a bit line. As shown in FIG. 1, the upper electrodes 62 are formed to extend in the X direction. Examples of materials used for the upper electrode 62 are selected from metallic materials having low electric resistance. Materials preferably used therefor include aluminum (Al), titanium (Ti), tungsten (W), an alloy thereof, nitride thereof, and silicide. More specifically, examples include W, WN, and TiN.

The upper electrodes 62, which are bit lines, are each arranged so as to correspond to the drain regions 12 included in one active region 10, as shown in FIG. 1. In other words, the drain regions 12 included in the same active region 10 are each connected to a different upper electrode 62.

On the contrary, the source regions 11 included in the same active region 10 are commonly connected to the source line 31. The source line 31 is formed to extend in the Y direction along the element isolation region 19. The source line 31 has a shape in which protrusions are formed in the X direction at the positions where the contact plugs 41 are formed. Therefore, one source line 31 is commonly provided by the source regions 11 arranged on one side (right side of FIG. 1, for example) out of the source regions 11 included in a certain active region 10, and source regions 11 arranged on the other side (left side of FIG. 1, for example) out of the source regions 11 included in the adjacent active region 10. The reason why the source line 31 is thus shaped is to lay the source line 31 in the Y direction while preventing interference with the lower electrode 61, which is a heater. The source line 31 is connected to a fixed potential such as a ground, directly or via a switch.

The recording layer 63 is composed of a phase change material. The phase change material constituting the recording layer 63 is not particularly limited insofar as the material assumes two or more phase states and has an electrical resistance that changes according to the phase state. A so-called chalcogenide material is preferably selected. A chalcogenide material is defined as an alloy that contains at least one or more elements selected from the group consisting of germanium (Ge), antimony (Sb), tellurium (Te), indium (In), selenium (Se), and the like. Examples include GaSb, InSb, InSe, $Sb_2Te_3$, GeTe, and other binary-based elements; $Ge_2Sb_2Te_5$, InSbTe, GaSeTe, $SnSb_2Te_4$, InSbGe, and other tertiary-based elements; and AgInSbTe, (GeSn)SbTe, GeSb(SeTe), $Te_{81}Ge_{15}Sb_2S_2$, and other quaternary-based elements.

A phase change material that includes a chalcogenide material may assume any phase state including an amorphous phase (non-crystalline phase) and a crystalline phase, with a relatively high-resistance state occurring in the amorphous phase, and a relatively low-resistance state occurring in the crystalline phase.

Figure 4:
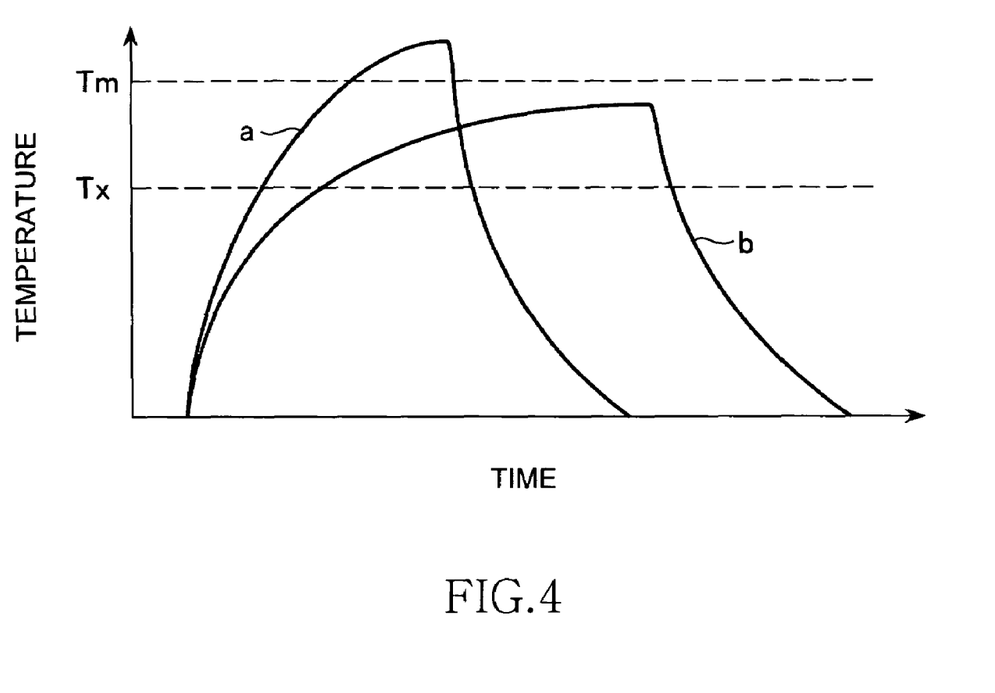
FIG. 4 is a graph showing the method for controlling the phase state of the phase change material that includes a chalcogenide material.

FIG. 4 is a graph showing the method for controlling the phase state of the phase change material that includes a chalcogenide material.

In order to place the phase change material that includes a chalcogenide material in the amorphous state, the material is cooled rapidly after being heated to a temperature equal to or higher than the melting point Tm, as indicated by the curve a in FIG. 4. In order to place the phase change material that includes a chalcogenide material in the crystalline state, the material is cooled slowly after being heated to a temperature at or above the crystallization temperature Tx and lower than the melting point Tm for a relatively long time, as indicated by the curve b in FIG. 4. Heating may be performed by applying an electric current. The temperature during heating may be controlled according to the amount of applied current, i.e., the current application time or the amount of current per unit time.

When a write current is passed to the recording layer 63, a portion immediately above the lower electrode 61 is heated, among the recording layer 63. That is, by passing a write current to the recording layer 63, the phase state of the chalcogenide material in a phase change region P shown in FIG. 2 and FIG. 3 can be changed. The film thickness of the recording layer 63 is not particularly limited, but is preferably set to about 100 nm. The width of the recording layer 63 (width in the Y direction) is not particularly limited, but can be set to about 300 nm as one example.

The physical configuration of the semiconductor memory device according to the embodiment has been described above.

Figure 5:
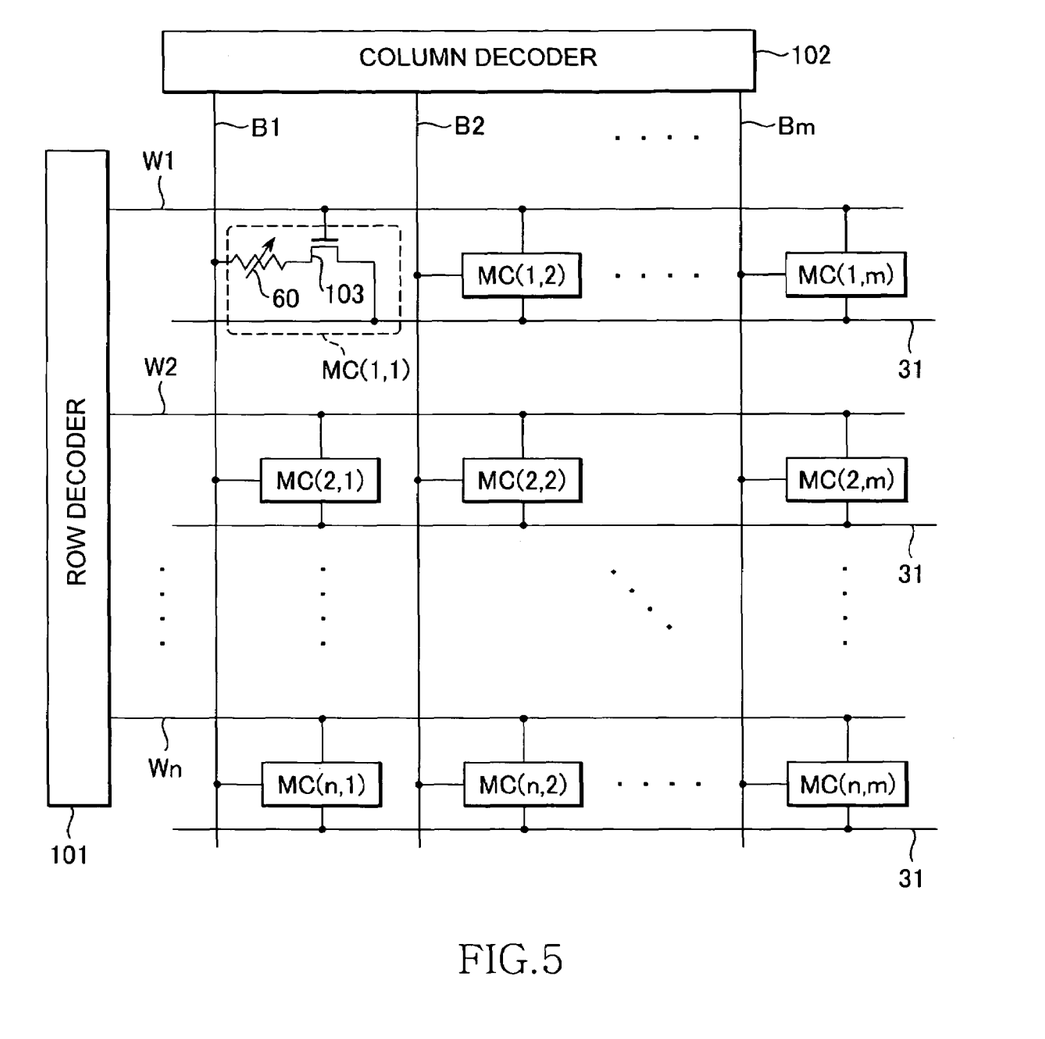
FIG. 5 is a circuit diagram of the semiconductor memory device according to the embodiment.

FIG. 5 is a circuit diagram of the semiconductor memory device according to the embodiment.

As shown in FIG. 5, the semiconductor memory device according to the embodiment has a matrix configuration of n rows×m columns. That is, the semiconductor memory device includes n word lines W1 to Wn, m bit lines B1 to Bm, and memory cells MC (1, 1) to MC (n, m) arranged at each intersection of the word line and the bit line. The word lines W1 to Wn are connected to a row decoder 101. The bit lines B1 to Bm are connected to a column decoder 102. Each memory cell MC is configured of the non-volatile memory element 60 and a cell transistor 103 connected in series between the corresponding bit line and a ground. A control terminal of the cell transistor 103 is connected to the corresponding word line.

The configuration of the non-volatile memory element 60 is as shown in FIG. 2 and FIG. 3. Therefore, the upper electrode 62 of the non-volatile memory element 60 is used as the corresponding bit line. The lower electrode 61 is connected to the corresponding cell transistor 103. The cell transistor 103 includes the drain region 12, three source regions 11 adjacent to the drain region 12, and the gate electrode 20 arranged on the semiconductor substrate between the drain region 12 and the three source regions 11.

Figure 6:
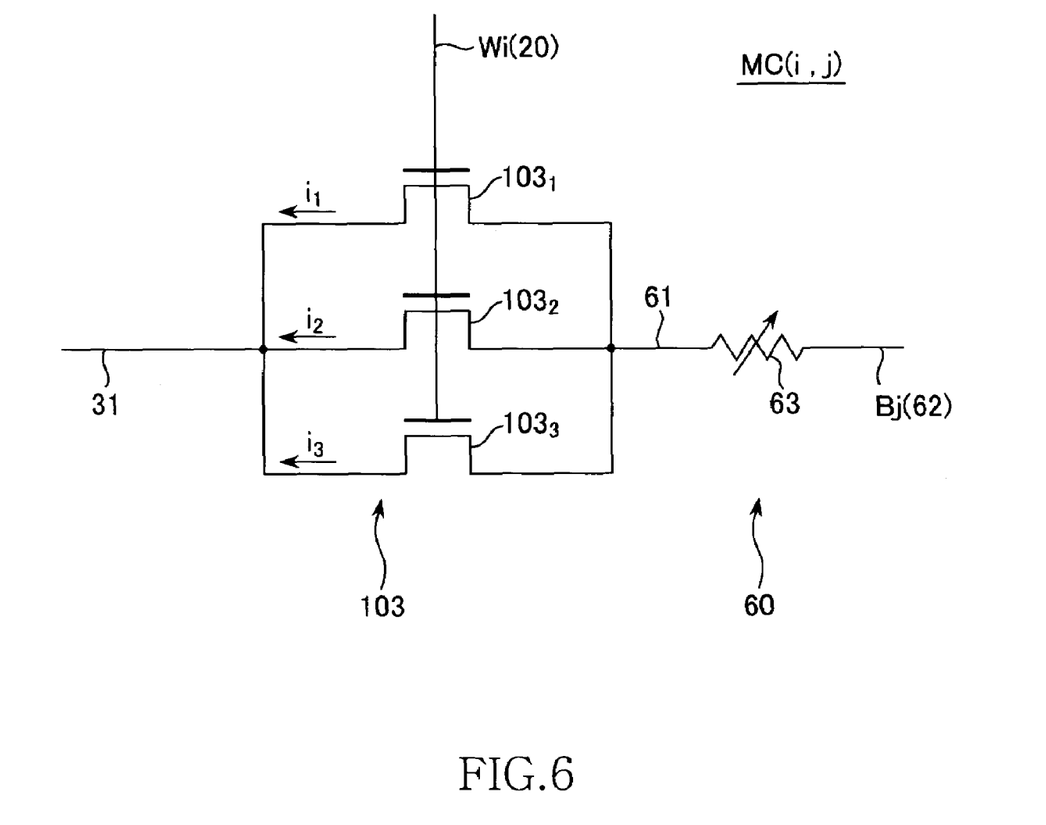
FIG. 6 is a circuit diagram of a memory cell.

FIG. 6 is a circuit diagram of a memory cell MC (i, j). The memory cell MC (i, j) is arranged at the intersection of a word line Wi and a bit line Bj. The remaining memory cells also have a similar circuit configuration.

As shown in FIG. 6, the cell transistor 103 included in the memory cell MC includes three cell transistors $103_1$, $103_2$, and $103_3$ connected in parallel.

More specifically, of the three cell transistors $103_1$, $103_2$, and $103_3$ the first cell transistor $103_1$ includes a certain drain region 12, the source region 11 adjacent on one side in the Y direction (upper side in FIG. 1, for example) as viewed from this drain region 12, and the gate electrode 20 arranged on the semiconductor substrate between the source region 11 and the drain region 12. The gate electrode 20 in this case corresponds to the second portions 22.

The second cell transistor $103_2$ includes the same drain region 12, the source region 11 adjacent in the X direction as viewed from this drain region 12, and the gate electrode 20 arranged on the semiconductor substrate between the source region 11 and the drain region 12. The gate electrode 20 in this case corresponds to the first portion 21.

The third cell transistor $103_3$ includes the same drain region 12, the source region 11 adjacent on the opposite side in the Y direction (lower side in FIG. 1, for example) as viewed from this drain region 12, and the gate electrode 20 arranged on the semiconductor substrate between the source region 11 and the drain region 12. The gate electrode 20 in this case corresponds to the second portion 22.

The gate electrode 20 and the drain region 12 of these three cell transistors $103_1$, $103_2$, and $103_3$ are commonly used. Although the source regions 11 vary with one another, the same electric potential is applied thereto by the source line 31. Therefore, the three cell transistors $103_1$, $103_2$, and $103_3$ can be substantially considered as one transistor. That is, the gate width is effectively enlarged, so that it becomes possible to pass a larger amount of on-current (i1+i2+i3). Thus, a sufficient amount of current for causing a phase change can be passed, so that a high speed data rewriting becomes possible.

Paths of the currents i1, i2, and i3 that flow through the three cell transistors $103_1$, $103_2$, and $103_3$ are shown also in FIG. 1. As shown in FIG. 1, the currents i1, i2, and i3 flow through three directions from one drain region 12. With such two-dimensional cell transistor arrangement, it becomes possible to pass a larger amount of currents by using a small area.

In the semiconductor memory device having such a configuration, data writing and data reading can be performed by activating any one of the word lines W1 to Wn by the row decoder 101, then passing the current to at least one of the bit lines B1 to Bm in this state. That is, in the memory cell where the corresponding word line is activated, the cell transistor 103 is turned on, so that the corresponding bit line is brought into a state of being connected to the source line 31 via the non-volatile memory element 60. Therefore, when a write current is passed to the bit line selected by a predetermined column decoder 102 in this state, it becomes possible to cause the phase change of the recording layer 63 included in the non-volatile memory element 60.

More specifically, the recording layer 63 becomes an amorphous phase by passing a predetermined amount of current so that the phase change material that configures the recording layer 63 is heated to temperatures equal to or higher than a melting point Tm shown in FIG. 4, and then rapidly cutting off the current so as to quench. On the other hand, the recording layer 63 becomes a crystalline phase by passing a current of which amount is smaller than the above predetermined amount so that the phase change material that configures the recording layer 63 is heated to temperatures equal to or higher than a crystallization temperature Tx and less than the melting point Tm shown in FIG. 4, and then gradually decreasing the amount of the current so as to quench, thereby promoting the crystalline growth.

Data reading can be also performed by activating any one of the word lines W1 to Wn by the row decoder 101, and then passing a read-out current to at least one of the bit lines B1 to Bm in this state. Since a resistance value is high in the memory cell where the recording layer 63 is changed to the amorphous phase, and a resistance value is low in the memory cell in which the recording layer 63 is changed to the crystalline phase, when these resistance values are detected by a sense amplifier (not shown), the phase state of the recording layer 63 can be grasped.

The phase state of the recording layer 63 can correspond to logical values to be stored. For example, when the amorphous phase state is defined as "0" and the crystalline phase state is defined as "1", one memory cell can hold 1 bit of data. It is also possible to control a crystallization ratio in a multistage manner or a linear manner by adjusting the time during which the recording layer 63 is kept at temperatures equal to or higher than the crystallization temperature Tx and less than the melting point Tm at the time of performing the phase change from the amorphous phase to the crystalline phase. Using such a method, when a mixture ratio of the amorphous phase and the crystalline phase is controlled in a multistage manner, one memory cell can store at least 2 bits of data. When the mixture ratio of the amorphous phase and the crystalline cell is controlled in a linear manner, an analog value can be stored.

As described above, in the semiconductor memory device according to the embodiment, since the cell transistor that corresponds to one non-volatile memory element 60 is configured of three transistors, a high current supply capability can be secured. Therefore, rewriting at a higher speed can be realized while enhancing the integration.

The present invention is in no way limited to the aforementioned embodiments, but rather various modifications are possible within the scope of the invention as recited in the claims, and naturally these modifications are included within the scope of the invention.

Figure 7:
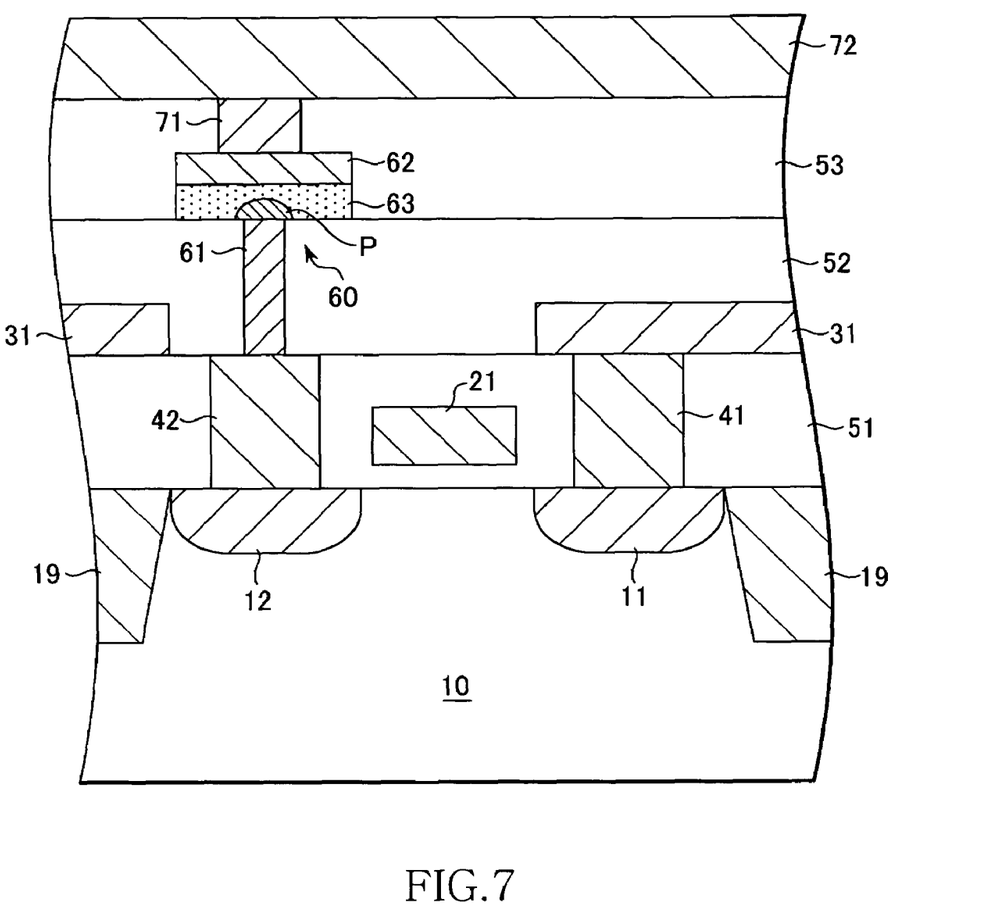
FIG. 7 is a schematic cross sectional view of a structure of relevant parts of a semiconductor memory device according to a modified embodiment of the present invention.

For example, in the above embodiment, although the recording layer 63 and the upper electrode 62 in the same row are common, these can be separated for each individual memory cell as shown in FIG. 7. In the example shown in FIG. 7, the recording layer 63 and the upper electrode 62 are separated for each memory cell, and the surrounding area thereof is covered with the interlayer insulation film 53. The upper electrode 62 is connected to the bit line 72 via the contact plug 71.

With such a configuration, it becomes possible to select, as materials for the upper electrode 62, a high resistance material similarly to the lower electrode 61, and to select, as materials for the bit line 72, metallic materials having lower electric resistance compared to that of the upper electrode 62 such as aluminum (Al), titanium, (Ti), tungsten (W), an alloy thereof, nitride thereof, and silicide, for example. Thus, radiation to the upper electrode 62 side and current loss caused by a bit line resistance can be reduced.

Figure 8:
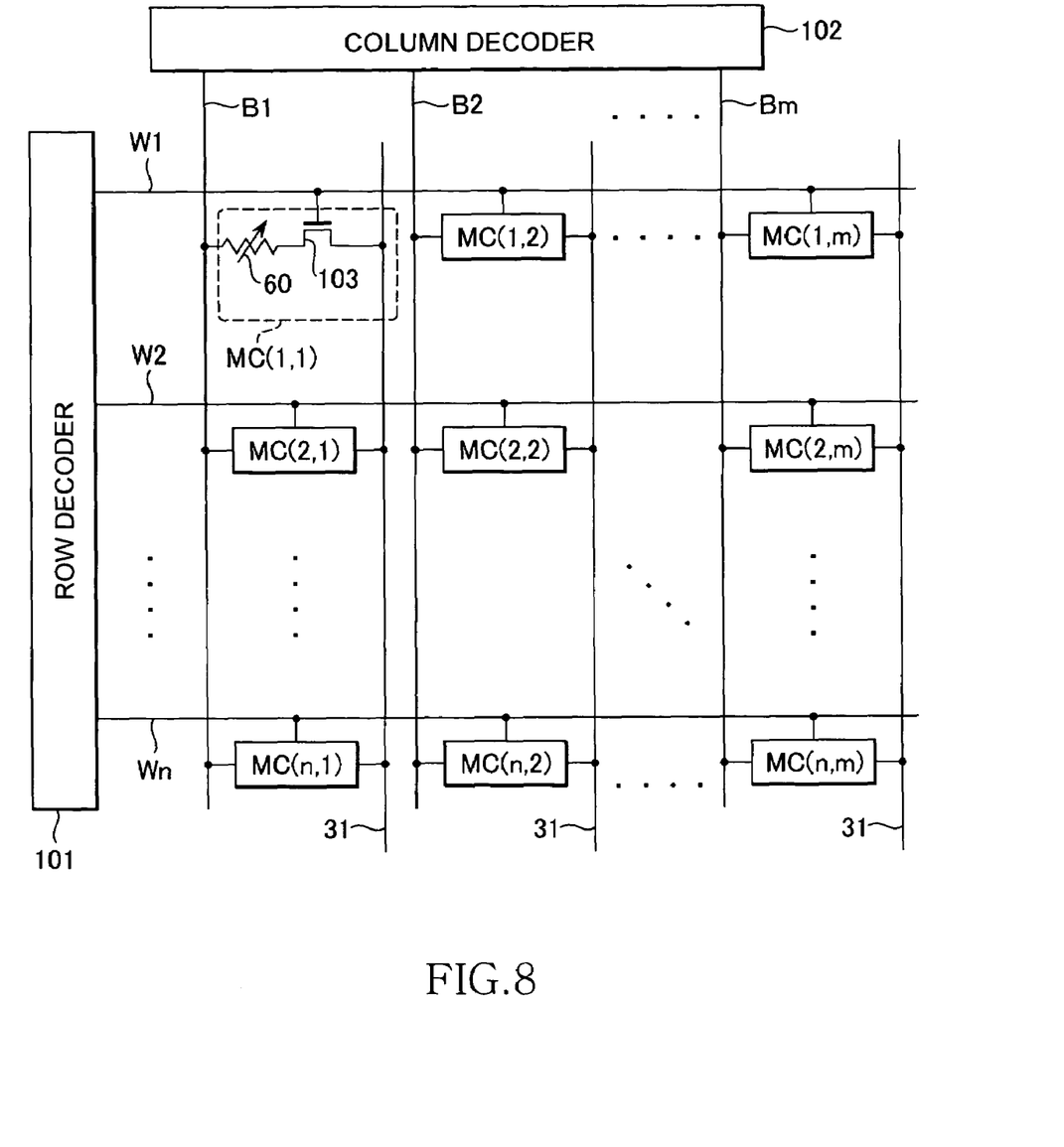
FIG. 8 is a circuit diagram of the semiconductor memory device according to the modified embodiment.
Figure 9:
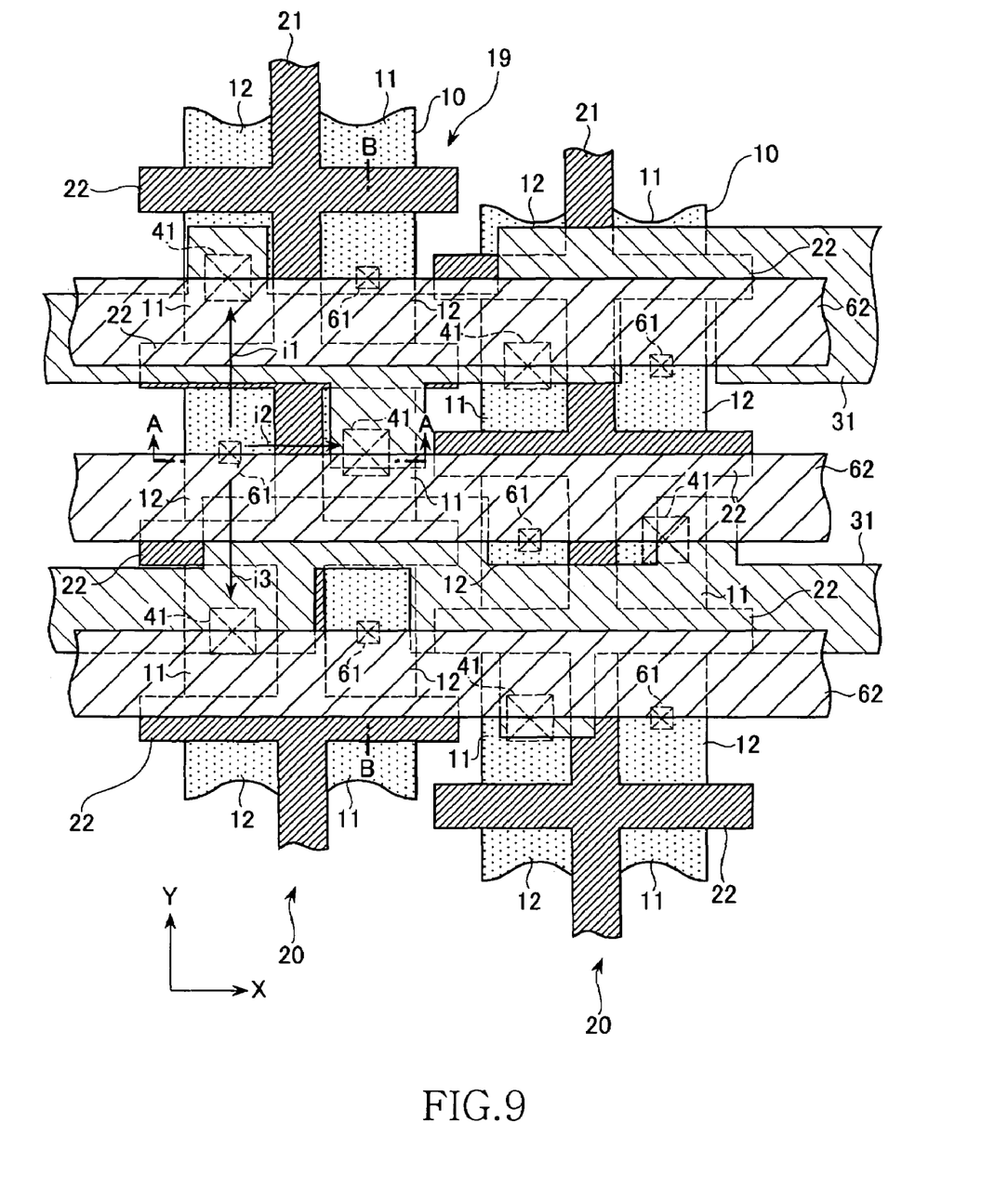
FIG. 9 is a schematic plan view of a structure of relevant parts of a semiconductor memory device according to a modified embodiment.

In the above embodiment, the source line 31 extends in the Y direction along the element isolation region 19. The present invention, however, is not limited thereto. The source line 31 can extend in the X direction so as to traverse the element isolation region 19. In this case, a schematic circuit diagram is as shown in FIG. 8. The actual layout thereof is shown as a schematic plan view in FIG. 9. When the source line 31 is laid in the same direction as the bit line, a current from the bit line does not concentrate in a specific source line 31 but is dispersedly passed. As a result, an uplift of an electric potential and the like can be prevented.

While the embodiment has explained an example in which the present invention is applied to a so-called PRAM, the applicable object of the present invention is not limited thereto. The present invention can be also applied to another memory that holds information depending on the presence or absence of a current that flows through a cell transistor, the magnitude of a current that flows through the cell transistor, or the like.

According to the present invention, it is possible to assign at least three cell transistors connected in parallel to one memory element, thereby further increasing an effective gate width as compared to the conventional semiconductor memory device. The semiconductor memory device of the present invention does not require a complicated control unlike the conventional semiconductor memory device. Thus, the current supply capability of the cell transistor is further enhanced, so that when the present invention is applied to the PRAM, the writing speed can be increased as compared to the conventional case.

What is claimed is:

1. A semiconductor memory device, comprising:
an active region having a plurality of source regions connected in common to a source line and a plurality of drain regions connected to corresponding bit lines;
a plurality of memory elements each inserted between associated one of the drain regions and the bit lines; and
a gate electrode formed on the active region, wherein
the gate electrode includes a first portion formed on a boundary in a first direction between each of the source regions and corresponding one of the drain regions, and a second portion formed on a boundary in a second direction different from the first direction between each of the source regions and corresponding one of the drain regions, and
the first portion and the second portion are short-circuited.

2. The semiconductor memory device as claimed in claim 1, wherein the second portion of the gate electrode has a plurality of portions positioned on one side as viewed from the first portion and a plurality of portions positioned on the other side as viewed from the first portion.

3. The semiconductor memory device as claimed in claim 1, wherein the memory element contains a phase change material.

4. A semiconductor memory device, comprising:
a first drain region;
a first source region positioned in a first direction as viewed from the first drain region;
a second source region positioned in a second direction that intersects with the first direction as viewed from the first drain region;
a third source region positioned in a third direction that is opposite to the first direction as viewed from the first drain region;
a gate electrode arranged on a semiconductor substrate between the first drain region, and the first to the third source regions;
a memory element connected to the first drain region;
a first element isolation region adjacently arranged in a fourth direction that is opposite to the second direction as viewed from the first drain region; and
a second element isolation region adjacently arranged in the second direction as viewed from the second source region.

5. The semiconductor memory device as claimed in claim 4, further comprising:
a second drain region positioned in the first direction as viewed from the second source region; and
a third drain region positioned in the third direction as viewed from the second source region, wherein
the gate electrode is also arranged on the semiconductor substrate between the second source region, and the second and the third drain regions.

6. The semiconductor memory device as claimed in claim 4, wherein the memory element contains a phase change material.

7. A semiconductor memory device, comprising:
a plurality of source regions and a plurality of drain regions arranged in a first active region in a matrix manner;

a first gate electrode for short-circuiting the source regions and the drain regions by application of a predetermined voltage, the gate electrode being formed on the first active region;

a plurality of bit lines each arranged so as to correspond to one of the drain regions;

at least one source line provided in common to the source regions; and a plurality of memory elements each connected between the drain region and the bit line.

8. The semiconductor memory device as claimed in claim 7, wherein the memory element contains a phase change material.

9. A semiconductor memory device, comprising:

a first active region;

a second active region adjacent to the first active region;

at least two first source regions selectively formed in the first active region and connected to a first source line;

at least one first drain region selectively formed in the first active region and connected to a first bit line through a first memory element, the first drain region being sandwiched between the first source regions to form the first and second channel portions which are arranged in parallel with each other and extend in a first direction;

a first gate electrode having first and second gate portions covering the first and second channel portions, respectively;

at least two second source regions selectively formed in the second active region and connected to a second source line;

at least one second drain region selectively formed in the second active region and connected to a second bit line through a second memory element, the first drain region being sandwiched between the second source regions to form a third and fourth channel portions which are arranged in parallel to each other and extend in the first direction; and second gate electrode having third and force gate portions covering the third and forth channel portions, respectively, wherein the first gate portion is out of alignment with any of the third and fourth gate portions and the third gate portion is out of alignment with any of the first and second gate portions.

10. The semiconductor memory device as claimed in claim 9, further comprising an element isolation region arranged between the first active region and the second active region.

11. The semiconductor memory device as claimed in claim 9, wherein the memory element contains a phase change material.

12. The semiconductor memory device as claimed in claim 1, wherein the source line and the bit lines are formed on different layers from each other.

13. The semiconductor memory device as claimed in claim 12, wherein the source line extends in the first direction and is connected to the source regions in common.

14. The semiconductor memory device as claimed in claim 7, further comprising:

a second active region having the same structure as the first active region; and a second gate electrode for short-circuiting source regions and drain regions included in the second active region by application of the predetermined voltage, the second gate electrode being formed on the second active region, wherein the first gate electrode and the second gate electrode are electrically isolated from each other.

15. The semiconductor memory device as claimed in claim 14, wherein each bit line is connected to one of the drain regions included in the first active region and one of the drain regions included in the second active region.

16. The semiconductor memory device as claimed in claim 9, wherein the second portions of the first gate electrode and second portions of the second gate electrode are arranged to be deviated by half a pitch of the second portions of the first and second gate electrodes.

17. A semiconductor memory device, comprising:

a first memory cell having a first transistor and a first memory element connected in series with the first transistor between a common line and a first bit line; and a second memory cell having a second transistor and a second memory element connected in series with the second transistor between the common line and a second bit line;

each of the first and second transistors including a drain region, a first source region defining a first channel region with a first part of the drain region, a second source region defining a second channel region with the second part of the drain region and a third source region defining a third channel region with a third part of the drain region, and a gate electrode having first, second, and third portions which cover the first, second, and third channel regions with an intervention of a gate insulating film, respectively.

* * * * *